United States Patent [19]

Kimura et al.

[11] Patent Number: 4,568,888

[45] Date of Patent: Feb. 4, 1986

[54] PLL FAST FREQUENCY SYNTHESIZER WITH MEMORIES FOR COARSE TUNING AND LOOP GAIN CORRECTION

[75] Inventors: Robert K. Kimura, Gardena; Benedict A. Itri, Torrance, both of Calif.

[73] Assignee: TRW Inc., Redondo Beach, Calif.

[21] Appl. No.: 550,070

[22] Filed: Nov. 8, 1983

[51] Int. Cl.$^4$ .................... H03L 7/06; H03L 7/08; H03L 7/16; H03L 7/18

[52] U.S. Cl. ........................................ 331/10; 331/11; 331/15; 331/16; 331/17; 331/25; 375/120; 455/260

[58] Field of Search .............. 331/10, 11, 12, 15, 331/16, 17, 25; 455/260; 375/120

[56] References Cited

U.S. PATENT DOCUMENTS

| | | | |
|---|---|---|---|
| 3,582,810 | 6/1971 | Gillette | 331/10 |
| 4,105,948 | 8/1978 | Wolkstein | 331/14 |
| 4,179,670 | 12/1979 | Kingsbury | 331/10 |
| 4,204,174 | 5/1980 | King | 331/10 |
| 4,410,860 | 10/1983 | Kipp et al. | 331/17 X |
| 4,453,136 | 6/1984 | Kelland | 331/16 X |

FOREIGN PATENT DOCUMENTS

| | | | |
|---|---|---|---|
| 0025876 | 4/1981 | European Pat. Off. | 331/10 |
| 0072593 | 2/1983 | European Pat. Off. | 331/10 |
| 2744432 | 7/1978 | Fed. Rep. of Germany | 331/17 |
| 2809792 | 9/1978 | Fed. Rep. of Germany | 331/17 |
| 0152333 | 11/1981 | Japan | 331/17 |
| 0045730 | 3/1982 | Japan | 331/10 |
| 0063936 | 4/1982 | Japan | 331/10 |
| 1442923 | 7/1976 | United Kingdom | 331/17 |
| 2099645 | 12/1982 | United Kingdom | 331/10 |
| 2107142 | 4/1983 | United Kingdom | 331/10 |

*Primary Examiner*—Eugene R. LaRoche
*Assistant Examiner*—D. C. Mis
*Attorney, Agent, or Firm*—Robert M. Wallace; Noel F. Heal

[57] ABSTRACT

A phase-locked loop frequency synthesizer apparatus for providing an output signal whose frequency jumps from one value to another, at regular intervals of time. Coarse tuning circuitry couples a prescribed signal to the apparatus' voltage-controlled oscillator (VCO), to drive the VCO immediately to the correct frequency each time a new frequency is selected, thereby substantially reducing the apparatus' settling time. In addition, adaptive coarse tuning circuitry continuously updates the values of stored coarse tuning information for each possible frequency, to correct for any drifts in the VCO's voltage/frequency characteristic. A VCO gain normalizer circuit amplifies the error signal coupled to the VCO by an amount that varies with the selected frequency, so as to correct for any non-uniformities in the apparatus' various elements, particularly the VCO, and to thereby provide a uniform loop gain.

41 Claims, 5 Drawing Figures

VCO GAIN NORMALIZER

LOOP FILTER

PLL FAST FREQUENCY SYNTHESIZER WITH MEMORIES FOR COARSE TUNING AND LOOP GAIN CORRECTION

BACKGROUND OF THE INVENTION

This invention was made with Government support under Contract No. N00039-81-0006 awarded by the Department of the Navy. The Government has certain rights in this invention.

This invention relates generally to phase-locked loop apparatus, and, more particularly, to apparatus of this kind that are configured to have a substantially uniform loop gain over their entire frequency range and that can be adjusted from one frequency to another with a low settling time.

Phase-locked loop apparatus are commonly used as a means of producing a signal having a precise, stable frequency. They can be used both as a receiver to detect signals of a prescribed frequency and as a frequency synthesizer to generate an output signal having a selectively-variable frequency. The basic elements of such apparatus include a voltage-controlled oscillator (VCO) for producing an output signal having a controlled frequency, a phase detector for comparing the phase of the output signal with that of a predetermined reference signal and for producing an error signal representing the detected phase difference, and a loop filter for filtering the error signal and coupling it to the VCO to controllably adjust the output signal's frequency.

In some instances, the phase detector has a gain that varies with frequency, which of course affects the apparatus' loop gain and thus its dynamic response. This is particularly the case when the phase detector is preceded by a divide-by-N circuit for frequency dividing the output signal by a selected integer N. In the case of a digital phase detector, which produces a sequence of pulses having durations proportional to the detected phase difference, the variable gain causes the pulse durations to vary not only with phase difference but also with frequency. There is a need for a convenient, reliable and inexpensive means for correcting for this gain variation in such a way that the phase detector has a substantially uniform gain for the entire frequency range.

It is desirable not only for the phase detector to have a uniform gain with frequency, but also for the entire phase-locked loop apparatus to have a uniform loop gain with frequency. A uniform loop gain has sometimes been achieved in the past using a linearizing network of resistors and diodes. The network's impedance, and thus its gain, is made to vary with frequency in such a manner that it corrects for any gain variations in the other elements of the apparatus, primarily the VCO. Linearizing networks of this kind have not proven entirely satisfactory, however, because they do not always effect a precise gain correction for all frequencies and because they usually have a limited response time when the apparatus changes frequency.

In some applications, phase-locked loop apparatus are configured as frequency synthesizers, for generating an output signal whose frequency hops from one value to another, at regular intervals of time. In such instances, it is ordinarily desirable for the apparatus to stabilize at the new frequency after as short a time delay as possible, i.e., have a low settling time. Minimizing settling time can be difficult if the magnitude of the frequency change is high, e.g., 1 gigahertz. Settling times on the order of several microseconds have not been heretofore achieved without substantial complexity to the apparatus, such as utilizing two completely separate phase-locked loops whose output signals are alternately selected only after they have stabilized at a selected frequency.

It should be appreciated from the foregoing that there is a definite need for a phase-locked loop apparatus of the kind described that can provide a low settling time, without undue complexity and expense. There also is a definite need for a phase-locked loop apparatus that can provide a substantially uniform phase detector gain and overall loop gain over the entire range of operating frequencies. The present invention fulfills these needs.

SUMMARY OF THE INVENTION

The present invention is embodied in a phase-locked loop apparatus, and a related method, that produces an output signal whose frequency can be selectively changed from one value to another with reduced settling time, and that has a substantially uniform loop gain over its entire frequency range. The apparatus includes a voltage-controlled oscillator (VCO) for producing the output signal, a phase detector for comparing the phases of the output signal and a predetermined reference signal and for producing a signal representing the detected phase difference, and a loop filter for suitably processing the phase detector signal to produce an error signal for controllably adjusting the VCO frequency. The apparatus can further include gain normalization means for amplifying the error signal by a selective gain factor that varies according to the VCO frequency, so as to compensate for any frequency sensitivity in the various elements, primarily the VCO, and thereby achieve a substantially uniform loop gain over the entire frequency range.

In accordance with one aspect of the invention, the gain normalization means includes memory means for storing information indicating the desired gain factor for each of the possible VCO frequencies, means for generating a frequency-select signal indicating the selected VCO frequency and for coupling this signal to the memory means, and amplifier means responsive to the information selected from the memory means by the frequency-select signal, for amplifying the error signal by the indicated gain factor. The apparatus thereby achieves a substantially uniform loop gain over its entire frequency range, which results in an improved control of the loop dynamics.

In more detailed aspects of the invention, the memory means stores the gain factor information as a plurality of digital words and it outputs a selected one of the words in accordance with the frequency-select signal. The amplifier means includes a plurality of switches whose positions are selected in accordance with the selected digital word, such that the amplifier means amplifies the error signal by the desired gain factor. A separate resistor is connected in series with each of the switches, and the amplifier means is configured such that no electrical current flows through any of the resistors when their corresponding switches are closed and the phase detector means detects no phase error between the output signal and the reference signal. This minimizes the effect that voltage offsets and component drifts will have on loop gain.

The phase-locked loop apparatus of the invention can be used with a digital phase detector of the kind that produces a sequence of pulses having durations generally proportional to the detected phase error. In some instances, these pulse durations can further vary according to the VCO frequency, especially when the VCO output signal is frequency-divided by a selected integer prior to comparison with the reference signal. This, of course, can adversely affect the apparatus' loop gain and thus its dynamic response.

In accordance with another aspect of the invention, the phase detector gain is adjusted using variable current source means for supplying a current whose magnitude is selected according to the VCO frequency, and switch means actuated by the phase detector pulse sequence, for switching the variable current to produce a current pulse sequence for coupling to the loop filter. The loop filter, in turn, filters the current pulse sequence, to produce the error signal for controlling the VCO. The magnitude of the variable current is selected to substantially compensate for the phase detector's gain variability with frequency. This substantially improves the phase-locked loop's dynamic response. The switch means is adapted to produce a current pulse sequence having a current in either of two polarities, depending upon the polarity of the phase error detected by the phase detector.

In more detailed aspects of this part of the invention, the variable current source means includes a memory for storing information indicating the desired current magnitude for each of a plurality of possible VCO frequencies, means for generating a frequency-select signal indicating the desired VCO frequency and for coupling this signal to the memory means, and means responsive to the frequency-select signal for reading the memory to determine the desired current magnitude and for generating a current having that magnitude. In this fashion, a very precise adjustment of the current and thus the phase detector gain can be achieved.

When the digital phase detector is used in combination with means for frequency dividing the VCO output signal, the apparatus can further include fractional-N means for periodically changing the integer by which the VCO signal is frequency divided, such that, on the average, the frequency is divided by a non-integer. This unfortunately introduces spurious signals into the error signal. The apparatus corrects for them using correction means for producing a prescribed phase error current signal that is summed with the current pulse signal produced by the switch means. This phase error current signal is periodic and has a generally sawtooth shape with a substantially constant peak amplitude.

The phase-locked loop apparatus of the invention is particularly suited for use as a frequency synthesizer, to generate an output signal whose frequency hops from one value to another, at regular intervals of time. To achieve a low settling time at each new frequency, the apparatus includes coarse tuning means for immediately applying to the VCO a signal level having a selected value that coarsely adjusts the VCO to the desired new frequency. In accordance with the invention, this coarse tuning means includes a memory for storing information indicating the nominal signal value required by the VCO to produce earth frequency in the predetermined frequency range, means for coupling a frequency-select signal to the memory to select a particular portion of the stored information, and signal generating means responsive to the selected coarse tuning information, for generating the appropriate dc coarse tuning signal and for coupling that signal to the VCO, to effect the desired coarse tuning.

In more detailed features of this part of the invention, the coarse tuning signal and the error signal are summed together and coupled as a sum signal to the VCO, to adjust its output frequency. The loop filter means can include switch means for selectively changing its number of poles, thereby permitting the user to selectively adjust the phase-locked loop apparatus' dynamic response.

The memory for storing the coarse tuning information can include both a fixed memory portion, which permanently stores the coarse tuning information, and an adjustable memory portion, which can be adjusted to reflect any changes in the VCO's gain/frequency constant over time and temperature. The adjustable memory portion can be adjusted using polarity detection means for detecting the polarity of the error signal immediately after a particular new frequency has been selected, and adjustment means for adjusting the coarse tuning information in accordance with the detected polarity. In this way, the initial frequency and phase error will be reduced whenever the particular frequency is again selected. The memory means preferably stores the coarse tuning information as a plurality of digital words, and the adjustment means preferably increments or decrements the digital word corresponding to a particular frequency in accordance with the polarity determination. Each of the plurality of digital words stored in the memory means can represent the coarse tuning information for a different frequency range, and each possible frequency within that range is therefore treated the same.

Other aspects and advantages of the present invention will become apparent from the following description of the preferred embodiment, taken in conjunction with the accompanying drawings, which illustrate, by way of example, the principles of the invention.

DESCRIPTION OF THE PREFERRED EMBODIMENT

Figure 1:
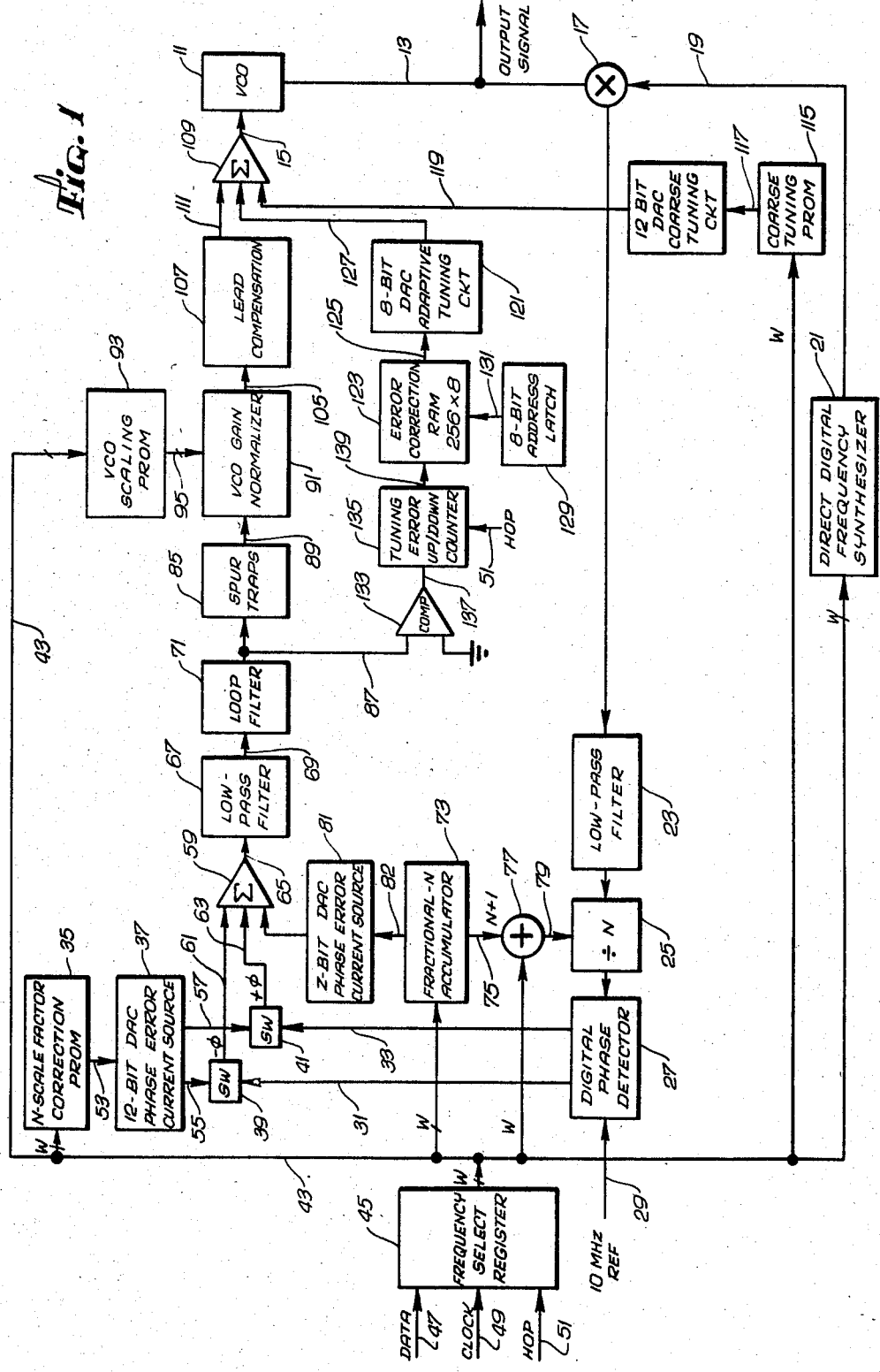
FIG. 1 is a simplified block diagram of the preferred embodiment of a phase-locked loop apparatus of the invention.

Referring now to the drawings, and particularly to FIG. 1, there is shown a phase-locked loop frequency synthesizer apparatus adapted to produce an output signal whose frequency hops from one value to another, from among a great number of possible values, at regular intervals of time. The particular frequency hop sequence is selected according to a digital word sequence supplied to the apparatus from an external control system (not shown). The apparatus includes a voltage-controlled oscillator (VCO) 11, for producing the output signal on line 13 in accordance with a control signal supplied to it on line 15. A mixer 17 shifts the VCO output signal downwardly in frequency by mixing it with a local oscillator signal supplied on line 19 from a direct digital frequency synthesizer 21. For simplicity in achieving an initial understanding of the phase-locked loop apparatus, it will be assumed that the frequency of the local oscillator signal is fixed.

A low-pass filter 23 filters the down-converted signal to remove the sum frequency component, after which a divide-by-N circuit 25 frequency divides the signal by a selected integer N. A digital phase detector 27 then compares the phases of the frequency-divided signal and a reference signal supplied on line 29. The reference signal has a fixed frequency (e.g., 10 MHz) and phase. The phase detector outputs a pair of pulse sequence signals on lines 31 and 33 in accordance with the detected phase difference. The signal on line 31 has pulse durations indicating a phase lag of the frequency-divided signal, and the signal on line 33 has pulse durations indicating a phase lead of the frequency-divided signal. The apparatus suitably processes the two pulse sequence signals to produce a low frequency phase error signal that is, in turn, further processed to produce the VCO control signal for controllably adjusting the VCO frequency.

In operation, the VCO control signal is automatically adjusted to the particular value that provides a selected VCO frequency, which, when mixed downwardly by the mixer 17 and frequency divided by the divide-by-N circuit 25, is exactly the same as the reference signal frequency. Any drift of the VCO frequency would result in a corresponding drift in the phase detector signal, and thus the VCO control signal, to drive the VCO frequency back to its appropriate value. It should be appreciated that selection of the integer N in the divide-by-N circuit automatically changes the VCO frequency, since the frequency of the frequency-divided signal is always the same as that of the reference signal, and since the frequency of the signal input to the divide-by-N circuit is always N times greater than that of the frequency-divided signal.

As previously mentioned, the pulse durations of the signals output by the digital phase detector 27 are generally proportional to the phase error between the frequency-divided signal and the fixed reference signal. The particular relationship between the phase error and pulse duration is determined by the phase detector gain. A given phase error in the frequency divided signal, however, corresponds to a phase error that is N times greater in the VCO signal. Accordingly, the combination of the divide-by-N circuit 25 and the digital phase detector have a gain that varies inversely with the particular N value. This affects the uniformity of the apparatus' loop gain and thus its dynamic response.

In accordance with one aspect of the invention, the variable gain of the combined digital phase detector 27 and divide-by-N circuit 25 is corrected using an N-scale factor correction PROM 35, a 12-bit digital-to-analog (D/A) converter phase error current source 37, and a pair of switches 39 and 41. These elements cooperate to produce a current pulse sequence whose product of current times time is substantially directly proportion to the phase error of the VCO output signal, regardless of its frequency. The loop gain of the phase-locked loop apparatus therefore is not adversely affected by reason of any change in the VCO frequency.

More particularly, the N-scale factor correction PROM 35 stores a separate digital word indicating the amount by which the phase detector signal must be corrected to provide a particular fixed gain, for each of the possible values of N. A particular one of the words is selected by a word-select input signal, designated W, which is supplied to the PROM on line 43 from a frequency-select register 45. This register transmits the word-select input signal not only to the PROM 35, but also to a number of additional circuits in the phase-locked loop apparatus, to control their operation as a function of the selected VCO frequency, as well. The selected word W is entered into the frequency-select register using a serial data input line 47 and a clock line 49. A hop signal supplied to the register on line 51 couples the stored word to the register's output terminal, for output on line 43.

The selected gain correction word is coupled on line 53 from the PROM 35 to the D/A phase error current source 37, which produces an electrical current having a corresponding magnitude. The current source supplies negative and positive versions of this current on lines 55 and 57, respectively, to the two switches 39 and 41. The two switches are controlled by the two signals supplied on lines 31 and 33 from the digital phase detector 27. One of these signals contains a pulse sequence when the phase of the frequency-divided signal leads that of the reference signal, and the other contains a pulse sequence when the phase of the frequency-divided signal lags that of the reference signal. Whichever one of the two switches is controllably opened and closed by its corresponding phase detector signal produces a sequence of current pulses having the prescribed magnitude and duration.

A summing amplifier 59 sums together the current pulse sequences supplied on lines 61 and 63 from the two respective switches 39 and 41. Only one of these current pulse sequences is, of course, present at a time. The resulting sum signal is coupled on line 65 from the summing amplifier to a low-pass filter 67, and, in turn, over line 69 to a loop filter 71. The frequency responses of the low-pass filter and loop filter are selected in accordance with well known phase locked loop techniques, to provide the desired dynamic characteristics for the loop. The loop filter filters an error signal whose dc value, positive or negative, is generally proportional to the detected phase error of the VCO output signal. As described below, this error signal is further processed and coupled to the VCO 11, to controllably adjust the frequency and phase of its output signal to minimize phase error.

As previously mentioned, the divide-by-N circuit 25 can be used to adjust the VCO's output frequency. In particular, incrementing the integer N by one automatically increments the VCO frequency by 10 MHz (the reference signal frequency). This occurs because the phase-locked loop apparatus automatically adjusts the VCO frequency such that after down converting in the mixer 17 and frequency dividing in the divide-by-N circuit, its frequency is equal to that of the reference signal. Thus, incrementing the integer N by one effects a 10 MHz increase in the VCO frequency.

To provide the phase-locked loop apparatus with a resolution finer than merely 10 MHz, the apparatus further includes a fractional-N accumulator 73, which is used in combination with the divide-by-N circuit 25 to make the apparatus function as though the integer N were a fraction. In particular, the fractional-N accumulator periodically increments the integer N by a count of one, to N+1, for a prescribed, limited time duration. Depending on the percentage of time the divide-by-N circuit is in its incremented state, a different fractional value can be achieved.

If, for example, fractions of ¼, ½ and ¾ are desired, the divide-by-N circuit 25 is incremented periodically to N+1, for duty cycles of ¼, ½ and ¾, respectively. This technique permits a selection of the VCO output frequency to finer resolutions of 2.5 MHz.

The fractional-N accumulator 73 receives the frequency-select word W on lines 43 and, depending on the particular word, outputs a count of one at the required times and duty cycle, and a count of zero at all other times. Its output signal of zero or one is transmitted on line 75 to a summer 77, where it is summed with certain bits of the frequency select word W supplied on lines 43. The summed value is transmitted on lines 79 to the divide-by-N circuit 25, to control the integral number by which it frequency divides its input signal.

An unfortunate consequence of introducing the fractional-N feature into the phase-locked loop apparatus is that it creates a spurious signal that is not ordinarily removed by the low-pass filter 67 and loop filter 71. This spurious signal has a generally sawtooth shape, and its frequency is determined by the particular fraction used. The amplitude of the spurious signal varies with the particular value of the integer N.

To substantially eliminate the spurious signal introduced by the fractional-N accumulator 73, the apparatus further includes a two-bit D/A converter phase error current source 81, which produces a four-step, generally sawtooth waveform having a constant peak amplitude and a shape that is complementary to that of the spurious signal. This current source is controlled by the fractional-N accumulator via line 82, which indicates the frequency and timing of the required correction. The resulting correction current is coupled on line 83 to the summing amplifier 59, where it is summed with the negative and positive current pulse sequences supplied by the switches 39 and 41. The gain adjustment effected by the N-scale factor correction PROM 35 and the 12-bit D/A converter phase error current source 37 compensates for the variable amplitude of the spurious signal, so that the correction signal produced by the two bit phase error current source can have a constant amplitude. This substantially reduces complexity.

As a further means of eliminating any residual portions of the spurious signals introduced by the fractional-N operation, the apparatus further includes a network of spur traps 85, centered at 2.5, 5.0, 7.5 and 10.0 MHz. Higher order harmonics of the spurious signal are eliminated by the low-pass filter 67. The spur traps are located following the loop filter 71, receiving the filtered error signal on line 87 from the loop filter and outputting the additionally-filtered signal on line 89.

Figure 3:
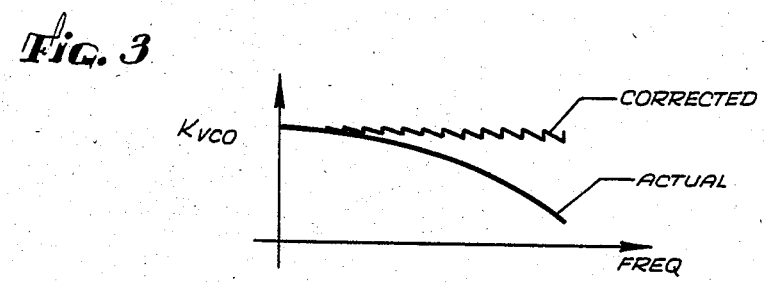
FIG. 3 is a graph of the gain correction effected by the VCO gain normalizer of FIG. 2.

Even though the apparatus includes the 12-bit D/A converter phase error current source 37 for correcting for gain variations in the combined phase detector 27 and divide-by-N circuit 25, other elements of the phase-locked loop apparatus likewise have gains that vary with frequency and require correction. The VCO 11 in particular has a gain constant, i.e., a change in frequency for a given change in voltage input, that varies substantially with frequency. The gain constant for a typical VCO is depicted in FIG. 3.

In accordance with another aspect of the invention, the phase-locked loop apparatus corrects for the gain variability in its various elements by further including a VCO gain normalizer 91 and an associated VCO scaling PROM 93. These two elements cooperate to amplify the filtered error signal by an amount that precisely corrects for the VCO's variable gain. The PROM receives the word-select signal W on lines 43, and it outputs the appropriate gain correction signal on lines 95 for coupling to the gain normalizer. The gain normalizer, in turn, adjusts its gain in accordance with the input control word it receives.

Figure 2:
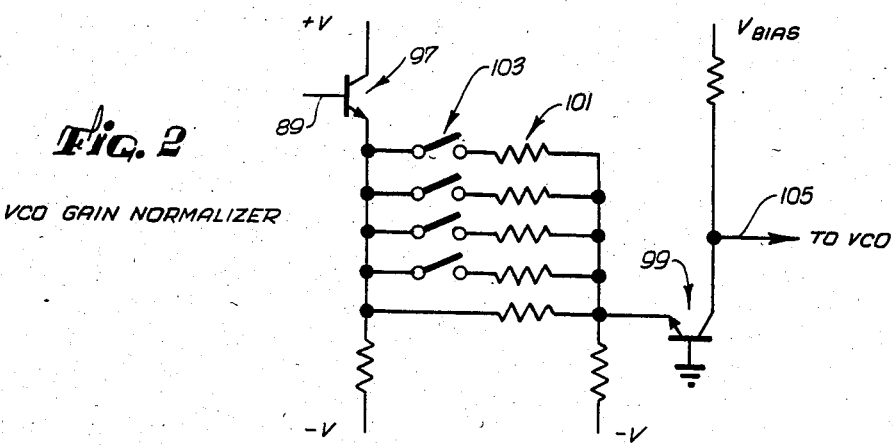
FIG. 2 is a schematic circuit diagram of the VCO gain normalizer circuit of FIG. 1.

FIG. 2 is a simplified schematic circuit diagram of the VCO gain normalizer 91, for amplifying the filtered error signal supplied on line 89 by an amount selected in accordance with the selected VCO frequency. The circuit includes a pair of matched NPN transistors 97 and 99 interconnected by a set of parallel resistors, designated by the reference numeral 101. Each resistor is connected in series with a separate semiconductor switch, designated by the reference numeral 103. The impedance of the parallel resistors, and thus the gain of the VCO gain normalizer, is controlled by selectively opening and closing the switches. The resistors can have resistances selected according to any desired relationship, such as a geometric series.

One important feature of the VCO gain normalizer circuit 91 is that when an error signal of zero volts is present, both emitters of the matched pair of transistors 97 and 99 will have voltage levels equal to one diode drop below ground. When this occurs, no electrical current flows through the resistors 101, so that any drifts in their respective resistances will have a negligible effect on the circuit's gain.

The combined gain of the VCO 11 and VCO gain normalizer 91 is depicted in the graph of FIG. 3, along with the uncorrected VCO gain. Each segment of the curve results from a particular arrangement of the switches 103 in the gain normalizer.

The amplified error signal produced by the gain normalizer circuit 91 is coupled on line 105 to a conventional lead compensation circuit 107 which corrects for a phase lag introduced by the spur traps 85. A summing amplifier 109 receives the lead-compensated error signal on line 111 and couples a corresponding output signal on line 15 to the VCO 11.

As previously mentioned, the phase-locked loop apparatus is used to provide an output signal whose frequency hops from one value to another, selected from among numerous possible values, at regular intervals of time. It is desirable for the apparatus to stabilize each time at its new frequency in as short a time as possible, preferably on the order of several microseconds or less. To reduce this settling time, the apparatus includes a 12-bit D/A converter coarse tuning circuit 113 and an associated coarse tuning PROM 115. These two elements cooperate to supply the particular dc voltage to the VCO 11 that corresponds to the nominal value the VCO requires to provide the selected frequency.

Figure 4:
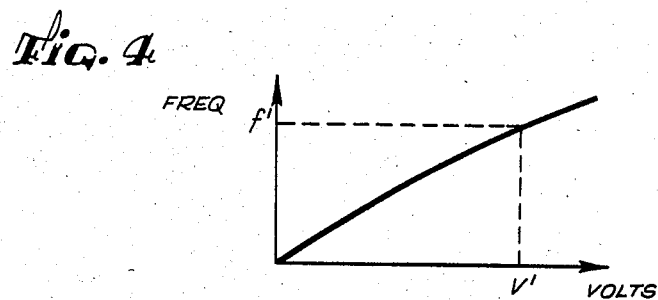
FIG. 4 is a graph of the relationship between voltage input and frequency output for the VCO of FIG. 1.

As shown in FIG. 4, the output frequency of the VCO 11 varies in a predetermined fashion with input voltage. The relationship between frequency and voltage is ideally linear, but invariably is not. The coarse tuning PROM 115 stores a series of words indicating the nominal voltages required by the VCO to provide all of its possible frequencies. In operation, the coarse tuning PROM receives the word select input W on lines 43 from the frequency-select register 45, whereupon it outputs the particular word corresponding to the selected frequency. This selected word is coupled on lines 117 to the D/A converter coarse tuning circuit 113, which responds by producing a corresponding analog current. The magnitude of this current is proportional to the nominal voltage level that, when applied to the VCO, will provide the selected frequency.

The coarse tuning current is transmitted on line 119 from the coarse tuning circuit 113 to the summing amplifier 109, where it is summed with the error signal and coupled in turn on line 15 to the VCO 11. Thus, when a given frequency is selected, the nominal voltage level that will provide that frequency is input to the VCO almost immediately. Any frequency error that remains is then quickly eliminated by the inherent feedback stability of the phase-locked loop apparatus. It automatically produces whatever error signal is required to supplement the coarse tuning signal and drive the VCO to the precise selected frequency.

The coarse tuning PROM 115 is programmed with the nominal coarse tuning information for the VCO 11 at the time the VCO is first constructed and tested. It is known, however, that the VCO is subject to drifts in its voltage/frequency response, both with time and with temperature. In some instances, the difference between the coarse tuning information stored in the PROM and the actual voltage/frequency characteristic of the VCO can be excessively large. The phase-locked loop apparatus corrects for this possibility by including an adaptive coarse tuning circuit 121 that supplements the fixed coarse tuning circuit 113 in a way that tracks any VCO drifts.

The adaptive coarse tuning circuit 121 is controlled by an error correction random-access memory (RAM) 123, which is continuously updated with information regarding the actual voltage/frequency characteristic for the VCO for each of a plurality of possible frequency ranges. Depending on the particular frequency selected, the appropriate word is output by the RAM for coupling on lines 125 to the adaptive coarse tuning circuit, which produces an electrical current having a corresponding magnitude. This current is transmitted on line 127 to the summing amplifier 109 for summing with the error signal and fixed coarse tuning current signal. An 8-bit address latch 129 responsive to the word-select signal supplied on lines 43 controls the RAM over lines 131.

When the word-select signal W selects a frequency for the VCO 11 that falls within a particular frequency range, the fixed coarse tuning circuit 113 outputs the appropriate current that will nominally drive the VCO to the selected frequency. IF the VCO has drifted from its original voltage/frequency characteristic for that frequency, however, the frequency to which it is initially driven will not be precisely correct and an error signal will therefore be produced that drives the VCO frequency up or down to the selected value. The direction of the initial frequency error is indicated by the error signal's polarity. The adaptive coarse tuning system therefore detects the error signal polarity immediately after each frequency hop is initiated, and it adjusts upwardly or downwardly the particular word it stores for the selected frequency range.

This coarse tuning adjustment is accomplished using a comparator 133 and a tuning error up/down counter 135. The comparator compares the error signal output by the loop filter 71 on line 87 with zero volts, to produce a corresponding digital polarity signal. This polarity signal is coupled on line 137 to the up/down counter, to either increment or decrement the selected word in the error correction RAM 123, via line 139 accordingly. The next time a frequency within that same frequency range is selected by the word-select signal W, the combination of the fixed coarse tuning current 113 and the adaptive coarse tuning current 121 will be incrementally closer to the correct value. The updating of the adaptive coarse tuning information is accomplished each time the frequency-select word W changes. Within a short period of time, therefore, the RAM will store the particular information for each frequency range that provides an adaptive coarse tuning current to initially drive the VCO 11 to a frequency as close as possible to the selected frequency.

It will be appreciated that the fixed coarse tuning circuit 113 and its associated PROM 115 effect a very coarse frequency adjustment of the VCO 11 and the adaptive coarse tuning circuit 121 and its associated RAM 123 effect a finer (but still coarse) frequency adjustment. These two adjustments drive the VCO sufficiently close to the selected frequency that the phase-locked loop error signal can very quickly drive it the remainder of the way.

Figure 5:
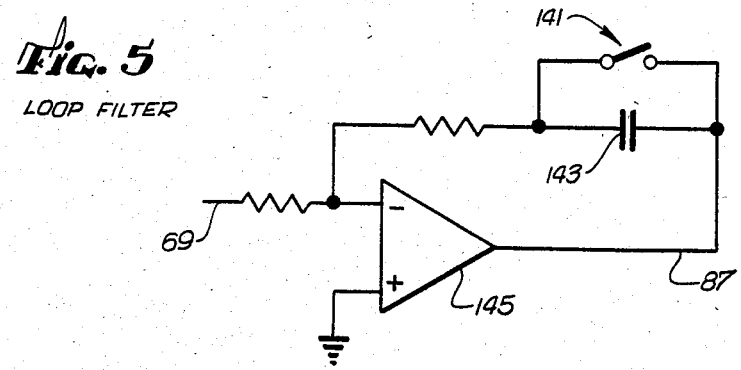
FIG. 5 is a schematic circuit diagram of the loop filter of FIG. 1.

To permit the user to selectively vary the phase-locked loop apparatus' dynamic response, the loop filter 71 includes means for varying its frequency response. As shown in FIG. 5, this takes the form of a semiconductor switch 141 shunting a capacitor 143 in the feedback loop of an operational amplifier 145. When the switch is opened, as shown, the capacitor is in the circuit and a second order phase-locked loop is created. This configuration has the benefit of a negligible steady state phase error. On the other hand, when the switch is closed, the capacitor is bypassed and the phase-locked loop is converted into a first order loop. In this configuration, a faster settling time is achieved, but a steady state phase error and thus non-zero error signal can be present. A first order loop configuration is preferred, because the adaptive coarse tuning circuit 121 ensures that the steady state frequency and phase error is small. This further reduces the apparatus' settling time at each newly selected frequency.

The divide-by-N circuit 25 is preferably reset by a reset signal (not shown) each time the frequency-select word W is changed. The resulting error signal therefore has an initial value of zero following each frequency hop.

As previously mentioned, selection of the integer N, along with selection of the fraction $\frac{1}{4}$, $\frac{1}{2}$ or $\frac{3}{4}$, can be used to select a VCO frequency to a resolution of 2.5 MHz. A finer resolution can be achieved by suitably varying the frequency of the local oscillator signal supplied to the mixer 17 on line 19 from the direct digital frequency synthesizer 21. In effect, selection of this local oscillator signal can result in the selection of a VCO frequency at any value within each 2.5 MHz step. This can be appreciated by recognizing that the phase-locked loop apparatus will automatically adjust the VCO frequency to track any change in the local oscillator signal frequency.

The direct digital frequency synthesizer 21 is a conventional circuit that can be implemented in any of a number of conventional ways. It receives as an input both a crystal oscillator signal having a prescribed, fixed frequency and the frequency-select word W supplied on lines 43. Because of inherent delays in the frequency synthesizer, it is desirable to couple the frequency-select word W to it a short time before that word is coupled to the remaining elements in the apparatus. Because of the inherent delays in the frequency synthesizer, the local oscillator signal it produces will then change to the newly-selected frequency at the same time the remaining elements of the apparatus accomplish their respective changes.

It should be appreciated from the foregoing description that the present invention provides an improved phase-locked loop frequency synthesizer apparatus of the kind that can produce an output signal whose frequency jumps from one value to another at regular intervals of time. The apparatus includes both a fixed coarse tuning system and an adaptive coarse tuning system that compensate for variations in the voltage/frequency characteristic of a voltage-controlled oscillator, whereby a significantly reduced settling time can be achieved. In addition, the apparatus includes circuitry for normalizing its loop gain over the entire range of frequencies at which it can operate, thereby providing a uniform dynamic response.

Although the invention has been described in detail with reference to the presently-preferred embodiment, it will be appreciated by those of ordinary skill in the art that various modifications can be made without departing from the invention. Accordingly, the invention is limited only by the following claims.

We claim:

1. Phase-locked loop apparatus having a substantially uniform loop gain over its entire frequency range, comprising:

voltage-controlled oscillator means for producing an output signal having a selected frequency;

phase detector means for comparing the phases of the output signal and a reference signal, to produce an error signal representing any phase difference; and gain normalization means for amplifying the error signal by a selected gain factor that varies according to the frequency of the output signal and for coupling the amplified error signal to the voltage-controlled oscillator means, to controllably adjust the output signal frequency, wherein the gain factor is selected such that the phase-locked loop apparatus has a substantially uniform loop gain over its entire frequency range, the gain normalization means including memory means for storing information indicating the desired gain factor for each of a plurality of possible output signal frequencies, means for generating a frequency-select signal indicating the selected output signal frequency and for coupling the frequency-select signal to the memory means, and amplifier means responsive to the gain factor information selected from the memory means by the frequency-select signal, for amplifying the error signal by the indicated gain factor.

2. Phase-locked loop apparatus as defined in claim 1, wherein:

the memory means stores the gain factor information as a plurality of digital words and outputs a selected one of the words in accordance with the frequency-select signal; and the amplifier means includes a plurality of switches whose positions are selected in accordance with the digital word output by the memory means, such that the amplifier means amplifies the error signal by the indicated gain factor.

3. Phase-locked loop apparatus as defined in claim 2, wherein:

the amplifier means further includes a separate resistor connected in series with each of the plurality of switches; and the amplifier means is configured such that substantially no electrical current flows through any of the resistors when their corresponding switches are closed and the error signal indicates there is zero phase error.

4. A method for generating an output signal having a controllably-adjustable frequency, comprising steps of:

generating an output signal having a selected frequency;

comparing the phases of the output signal and a reference signal, to produce an error signal representing any phase difference; and amplifying the error signal by a selected gain factor that varies according to the frequency of the output signal and using the amplified error signal in the step of generating to controllably adjust the output signal frequency, the step of amplifying including steps of storing in a memory information indicating the desired gain factor for each of a plurality of possible output signal frequencies, generating a frequency-select signal indicating the selected output signal frequency and coupling the frequency-select signal to the memory, and amplifying the error signal by the gain factor indicated by the gain factor information selected from the memory by the frequency-select signal.

5. A method as defined in claim 4, wherein:

the step of storing stores the gain factor information as a plurality of digital words;

the step of selecting selects a particular word from the memory in accordance with the frequency-select signal, the word corresponding to the selected frequency; and the step of amplifying includes steps of selectively adjusting a plurality of switches in accordance with the digital word selected from the memory, such that the step of amplifying amplifies the error signal by the indicated gain factor.

6. Gain adjustment apparatus for use in a phase-locked loop of the kind that includes a voltage-controlled oscillator for producing an output signal having a selected frequency, a digital phase detector for producing a sequence of control pulses having durations proportional to any difference in phase between the output signal and a reference signal, and a loop filter for filtering an error signal in accordance with the sequence of control pulses to control the voltage-controlled oscillator, wherein the digital phase detector has a gain that varies in accordance with the frequency of the output signal, the gain adjustment apparatus comprising:

variable current source means for supplying a current whose magnitude is selected according to the frequency of the output signal produced by the voltage-controlled oscillator; and switch means actuated by the sequence of control pulses produced by the digital phase detector, for switching the current supplied by the variable current source means to produce a current pulse sequence for coupling to the loop filter;

wherein the loop filter filters the error signal for controlling the voltage-controlled oscillator in accordance with the current pulse sequence;

and wherein the magnitude of the current supplied by the variable current source means is selected to substantially compensate for the variability of the digital phase detector gain with frequency, whereby the phase-locked loop has a loop gain that is substantially uniform, regardless of the frequency of its output signal.

7. Gain adjustment apparatus as defined in claim 6, wherein the variable current source means includes:
  memory means for storing information indicating the desired current magnitude for each of a plurality of possible frequencies of the output signal produced by the voltage-controlled oscillator;
  means for generating a frequency-select signal indicating the selected frequency of the output signal and for coupling the frequency-select signal to the memory means; and
  means responsive to the information selected from the memory means by the frequency-select signal, for generating an electrical current having the indicated magnitude.

8. Gain adjustment apparatus as defined in claim 6, wherein the switch means is adapted to produce a current pulse sequence having a current in either of two polarities, depending upon the polarity of the sequence of control pulses produced by the digital phase detector.

9. Gain adjustment apparatus as defined in claim 6, wherein:
  the digital phase detector includes
  divide-by-N means for dividing the frequency of the voltage-controlled oscillator output signal by a selected integer N, to produce a frequency-divided signal, and
  means for comparing the relative phases of the frequency-divided signal and a reference signal having a fixed frequency, to produce the sequence of control pulses; and
  the gain adjustment apparatus further includes
  fractional-N means for periodically changing the integer N from its selected value such that, on the average, the divide-by-N means divides the frequency of the output signal by a non-integer; and
  correction means for producing a prescribed phase error current signal and for summing it with the current pulse sequence produced by the switch means, to correct for spurious signals introduced into the error signal by the fractional-N means.

10. Gain adjustment apparatus as defined in claim 9, wherein the phase error current signal produced by the correction means has a substantially constant peak amplitude.

11. Gain adjustment apparatus as defined in claim 9, wherein the phase error current signal produced by the correction means is a periodic signal having a generally sawtooth shape.

12. Phase-locked loop apparatus having a substantially uniform loop gain over its entire frequency range, comprising:
  voltage-controlled oscillator means for producing an output signal having a selected frequency;
  digital phase detector means for producing a sequence of control pulses having durations that vary both in accordance with any difference in phase between the output signal and a reference signal and in accordance with the selected frequency;
  loop filter means for filtering an error signal in accordance with the sequence of control pulses, to control the voltage-controlled oscillator means;
  variable current source means for supplying a current whose magnitude is selected according to the selected frequency of the voltage-controlled oscillator means; and
  switch means actuated by the sequence of control pulses produced by the digital phase detector means, for switching the current supplied by the variable current source means to produce a current pulse sequence for coupling to the loop filter means;
  wherein the loop filter means filter the error signal for controlling the voltage-controlled oscillator means in accordance with the current pulse sequence;
  and wherein the magnitude of the current supplied by the variable current source means is selected to substantially compensate for the variability of the digital phase detector means gain with frequency, whereby the phase-locked loop has a loop gain that is substantially uniform, regardless of the frequency of its output signal.

13. Phase-locked loop apparatus as defined in claim 12, wherein the variable current source means includes:
  memory means for storing information indicating the desired current magnitude for each of a plurality of possible frequencies of the output signal produced by the voltage-controlled oscillator means;
  means for generating a frequency-select signal indicating the selected frequency of the output signal and for coupling the frequency-select signal to the memory means; and
  means responsive to the information selected from the memory means by the frequency-select signal, for generating an electrical current having the indicated magnitude.

14. Phase-locked loop apparatus as defined in claim 12, wherein the switch means is adapted to produce a current pulse sequence having a current in either of two polarities, depending upon the polarity of the sequence of control pulses produced by the digital phase detector means.

15. Phase-locked loop apparatus as defined in claim 12, wherein:
  the digital phase detector includes
  divide-by-N means for dividing the frequency of the voltage-controlled oscillator means output signal by a selected integer N, to produce a frequency-divided signal, and
  means for comparing the relative phases of the frequency-divided signal and a reference signal having a fixed frequency, to produce the sequence of control pulses; and
  the phase-locked loop apparatus further includes
  fractional-N means for periodically changing the integer N from its selected value such that, on the average, the frequency of the output signal is divided by a non-integer, and
  correction means for producing a prescribed phase error current signal and for summing it with the current pulse sequence produced by the switch means, to correct for spurious signals introduced into the error signal by the fractional-N means.

16. Phase-locked loop apparatus as defined in claim 15, wherein the phase error current signal produced by the correction means has a substantially constant peak amplitude.

17. Phase-locked loop apparatus as defined in claim 15, wherein the phase error current signal produced by the correction means is a periodic signal having a generally sawtooth shape.

18. Phase-locked loop apparatus as defined in claim 12, wherein:

the apparatus further includes local oscillator means for generating a local oscillator signal having a predetermined frequency; and the digital phase detector means includes means for mixing the output signal produced by the voltage-controlled oscillator means with the local oscillator signal, to produce a reduced-frequency signal having a substantially lower frequency than the output signal, and means for comparing the relative phases of the reduced-frequency signal and the reference signal, to produce the sequence of control pulses.

19. Phase-locked loop apparatus as defined in claim 18, wherein the local oscillator means includes means for selecting the frequency of the local oscillator signal, thereby correspondingly selecting the frequency of the reduced frequency signal and, by operation of the phase-locked loop apparatus, the frequency of the output signal produced by the voltage-controlled oscillator.

20. A gain adjustment method for use in a phase-locked loop apparatus of the kind that includes a voltage-controlled oscillator for producing an output signal having a selected frequency, a digital phase detector for producing a sequence of control pulses having durations proportional to any difference in phase between the output signal and a reference signal, and a loop filter for filtering an error signal in accordance with the sequence of control pulses to control the voltage-controlled oscillator, wherein the digital phase detector has a gain that varies in accordance with the frequency of the output signal, the gain adjustment method comprising steps of:

supplying a current whose magnitude is selected eaccording to the frequency of the output signal produced by the voltage-controlled oscillator; and switching the current supplied in the step of supplying, in accordance with the sequence of control pulses produced by the digital phase detector, to produce a current pulse sequence for coupling to the loop filter;

wherein the loop filter filters the error signal for controlling the voltage-controlled oscillator in accordance with the current pulse sequence;

and wherein the magnitude of the current supplied in the step of supplying is selected to substantially compensate for the variability of the digital phase detector gain with frequency, whereby the phase-locked loop has a loop gain that is substantially uniform, regardless of the frequency of its output signal.

21. A gain adjustment method as defined in claim 20, wherein the step of supplying includes steps of:

storing in a memory information indicating the desired current magnitude for each of a plurality of possible frequencies of the output signal produced by the voltage-controlled oscillator;

generating a frequency-select signal indicating the selected frequency of the output signal and coupling the frequency-select signal to the memory; and generating an electrical current having a magnitude indicated by the information selected from the memory by the frequency-select signal.

22. A gain adjustment method as defined in claim 20, wherein the step of switching produces a current pulse sequence having a current in either of two polarities, depending upon the polarity of the sequence of control pulses produced by the digital phase detector.

23. A gain adjustment method as defined in claim 20, wherein:

the digital phase detector includes divide-by-N means for dividing the frequency of the voltage-controlled oscillator output signal by a selected integer N, to produce a frequency-divided signal, and means for comparing the relative phases of the frequency-divided signal and a reference signal having a fixed frequency, to produce the sequence of control pulses; and the gain adjustment method further includes steps of periodically changing the integer N from its selected value such that, on the average, the divide-by-N means divides frequency of the output signal by a non-integer; and producing a prescribed phase error current signal and summing it with the current pulse sequence produced in the step of switching, to correct for spurious signals introduced into the error signal by the step of periodically changing.

24. A gain adjustment method as defined in claim 23, wherein the phase error current signal produced in the step of producing has a substantially constant peak amplitude.

25. A gain adjustment method as defined in claim 23, wherein the phase error current signal produced in the step of producing is a periodic signal having a generally sawtooth shape.

26. A method for generating an output signal having a controllably-adjustable frequency, comprising steps of:

generating an output signal having a selected frequency;

comparing the phases of the output signal and a reference signal, to produce a sequence of control pulses having durations that vary both in accordance with any phase difference and in accordance with the selected frequency;

outputting an error signal in accordance with the sequence of control pulses, for use in the step of generating, to controllably adjust the output signal frequency;

supplying a current whose magnitude is selected according to the selected frequency; and switching the current supplied in the step of supplying, in accordance with the sequence of control pulses produced in the step of comparing, to produce a current pulse sequence for use in the step of outputting;

wherein the step of outputting outputs the error signal for use in the step of generating in accordance with the current pulse sequence;

and wherein the magnitude of the current supplied in the step of supplying is selected to substantially compensate for the variability of the control pulse duration with frequency.

27. A method as defined in claim 26, wherein the step of supplying includes steps of:

storing in a memory information indicating the desired current magnitude for each of a plurality of possible frequencies of the output signal produced in the step of generating;

generating a frequency-select signal indicating the selected frequency of the output signal and coupling the frequency-select signal to the memory; and generating an electrical current having a magnitude indicated by the information selected from the memory by the frequency-select signal.

28. A method as defined in claim 26, wherein the step of switching produces a current pulse sequence having a current in either of two polarities, depending upon the polarity of the sequence of control pulses produced in the step of comparing.

29. A method as defined in claim 26, wherein:
the step of comparing includes steps of
dividing the frequency of the output signal by a selected integer N, to produce a frequency-divided signal, and
comparing the relative phases of the frequency-divided signal and a reference signal having a fixed frequency, to produce the sequence of control pulses; and
the method further includes steps of
periodically changing the integer N from its selected value such that, on the average, the frequency of the output signal is divided by a non-integer, and
producing a prescribed phase error current signal and summing it with the current pulse sequence produced in the step of switching, to correct for spurious signals introduced into the error signal by the step of periodically changing.

30. A method as defined in claim 29, wherein the phase error current signal produced in the step of producing has a substantially constant peak amplitude.

31. A method as defined in claim 29, wherein the phase error current signal produced in the step of producing is a periodic signal having a generally sawtooth shape.

32. A method as defined in claim 26, wherein:
the method further includes a step of generating a local oscillator signal having a predetermined frequency; and
the step of comparing includes steps of
mixing the output signal with the local oscillator signal, to produce a reduced-frequency signal having a substantially lower frequency than the output signal, and
comparing the relative phases of the reduced-frequency signal and the reference signal, to produce the sequence of control pulses.

33. A method as defined in claim 32, wherein the step of generating a local oscillator signal includes a step of selecting the frequency of the local oscillator signal, thereby correspondingly selecting the frequencies of the reduced frequency signal and the output signal.

34. Phase-locked loop frequency synthesizer apparatus adapted to generate an output signal having a controllably selectable frequency, comprising:
voltage-controlled oscillator means for generating an output signal having a frequency that is controllably variable over a predetermined frequency range;
phase detector means for comparing the phases of the output signal and a reference signal, and for producing an error signal representing any phase difference, the error signal being coupled to the voltage-controlled oscillator means to controllably vary the frequency and phase of the output signal so as to reduce the phase difference; and
coarse tuning means for producing a dc coarse tuning signal for coupling to the voltage-controlled oscillator means, to effect a coarse selection of the output signal frequency, the coarse tuning means including
memory means for storing coarse tuning information indicating the nominal dc coarse tuning signal value required by the voltage-controlled oscillator means to provide each output signal frequency in the predetermined frequency range;
frequency selection means for generating a frequency-select signal indicating the selected output signal frequency and for coupling the frequency-select signal to the memory means;
signal generating means responsive to the coarse tuning information selected from the memory means by the frequency-select signal, for supplying the appropriate dc coarse tuning signal to the voltage-controlled oscillator means, to effect a coarse selection of the output signal frequency; and
adaptive tuning means responsive to the error signal produced by the phase detector means, for adjusting the coarse tuning information stored in the memory means, the adaptive tuning means including
polarity detection means for detecting the polarity of the error signal immediately after the frequency selection means first selects a particular frequency and for producing a corresponding polarity signal; and
adjustment means for adjusting the coarse tuning information stored in the memory means in accordance with the polarity signal, such that the error signal will be reduced whenever the frequency selection means again selects the particular frequency.

35. Phase-locked loop frequency synthesizer apparatus as defined in claim 34, wherein:
the memory means stores the coarse tuning information as a plurality of digital words; and
the adjustment means increments or decrements the digital word corresponding to the particular frequency selected, according to the polarity signal.

36. Phase-locked loop frequency synthesizer apparatus as defined in claim 35, wherein each of the plurality of digital words stored in the memory means represents the coarse tuning information for a separate range of frequencies within the predetermined frequency range.

37. Phase-locked loop frequency synthesizer apparatus adapted to generate an output signal having a controllably selectable frequency, comprising:
voltage-controlled oscillator means for generating an output signal having a frequency that is controllably variable over a predetermined frequency range;
phase detector means for comparing the phases of the output signal and a reference signal, and for producing an error signal representing any phase difference, the error signal being coupled to the voltage-controlled oscillator means to controllably vary the frequency and phase of the output signal so as to reduce the phase difference; and
coarse tuning means for producing a dc coarse tuning signal for coupling to the voltage-controlled oscillator means, to effect a coarse selection of the output signal frequency, the coarse tuning means including
memory means for storing coarse tuning information indicating the nominal dc coarse tuning signal value required by the voltage-controlled oscillator means to provide each output signal frequency in the predetermined frequency range;

frequency selection means for generating a frequency-select signal indicating the selected output signal frequency and for coupling the frequency-select signal to the memory means;

signal generating means responsive to the coarse tuning information selected from the memory means by the frequency-select signal, for supplying the appropriate dc coarse tuning signal to the voltage-controlled oscillator means, to effect a coarse selection of the output signal frequency; and adaptive tuning means responsive to the error signal produced by the phase detector means, for adjusting the coarse tuning information stored in the memory means;

wherein the memory means includes adjustable memory means and fixed memory means, both for storing coarse tuning information indicating the nominal signal value required by the voltage-controlled oscillator means to provide each output signal frequency in the predetermined range of frequencies, both memory means outputting selected coarse tuning information in accordance with the frequency-select signal, and the fixed memory means permanently storing its coarse tuning information;

the adaptive tuning means adjusts the coarse tuning information stored in the adjustable memory means;

the signal generating means is responsive to the coarse tuning information output by both the adjustable memory means and the fixed memory means, to generate the dc coarse tuning signal; and the voltage-controlled oscillator means includes means for summing together the error signal produced by the phase detector means and the dc coarse tuning signal produced by the signal generating means, to produce a sum signal for use in adjusting its output signal frequency.

38. A frequency synthesizing method comprising steps of:

generating an output signal having a selected frequency;

comparing the phases of the output signal and a reference signal, and producing an error signal representing any phase difference, the error signal being used in the step of generating, to controllably vary the frequency and phase of the output signal so as to reduce the phase difference;

producing a dc coarse tuning signal for use in the step of generating, to effect a coarse selection of the output signal frequency, the step of producing including steps of storing coarse tuning information in a memory, the stored information indicating the nominal dc coarse tuning signal value required in the step of generating to provide each of a plurality of output signal frequencies;

selecting from the memory the stored information corresponding to a selected one of the plurality of output signal frequencies; and generating the dc coarse tuning signal in accordance with the coarse tuning information selected from the memory for use in the step of generating, to coarsely adjust the output signal frequency to the selected value; and adjusting the coarse tuning information stored in the memory, in accordance with the error signal produced in the step of comparing, the step of adjusting including steps of detecting the polarity of the error signal immediately after the step of selecting first selects a particular frequency and producing a corresponding polarity signal; and adjusting the coarse tuning information stored in the memory in accordance with the polarity signal, such that the error signal will be reduced whenever the step of selecting again selects the particular frequency.

39. A frequency synthesizing method as defined in claim 38, wherein:

the step of storing stores the coarse tuning information as a plurality of digital words; and the step of adjusting increments or decrements the digital word corresponding to the particular frequency selected, according to the polarity signal.

40. A frequency synthesizing method as defined in claim 39, wherein each of the plurality of digital words stored in the memory represents the coarse tuning information for a separate range of frequencies, such that the step of generating the dc coarse tuning signal generates the same signal for a plurality of selected frequencies.

41. A frequency synthesizing method comprising steps of:

generating an output signal having a selected frequency;

comparing the phases of the output signal and a reference signal, and producing an error signal representing any phase difference, the error signal being used in the step of generating, to controllably vary the frequency and phase of the output signal so as to reduce the phase difference;

producing a dc coarse tuning signal for use in the step of generating, to effect a coarse selection of the output signal frequency, the step of producing including steps of storing coarse tuning information in a memory, the stored information indicating the nominal dc coarse tuning signal value required in the step of generating to provide each of a plurality of output signal frequencies;

selecting from the memory the stored information corresponding to a selected one of the plurality of output signal frequencies; and generating the dc coarse tuning signal in accordance with the coarse tuning information selected from the memory for use in the step of generating, to coarsely adjust the output signal frequency to the selected value; and adjusting the coarse tuning information stored in the memory, in accordance with the error signal produced in the step of comparing;

wherein the memory used in the step of storing includes both an adjustable memory and a fixed memory, both for storing coarse tuning information indicating the nominal signal value required in the step of generating to provide each of the plurality of output signal frequencies, the fixed memory permanently storing its coarse tuning information;

the adaptive tuning means adjusts the coarse tuning information stored in the adjustable memory;

the step of selecting simultaneously selects stored information from both the adjustable memory and the fixed memory;

the step of generating the dc coarse tuning signal is performed in accordance with the coarse tuning information selected from both the adjustable memory and the fixed memory; and the step of generating an output signal includes a step of summing together the error signal produced in the step of comparing and the dc coarse tuning signal produced in the step of generating, to produce a sum signal for use in adjusting the output signal frequency.

* * * * *